(12) United States Patent
Healy (10) Patent No.: US 11,584,109 B2
(45) Date of Patent: Feb. 21, 2023

(54) POLY-SUPPORTED COPPER FOIL

(71) Applicant: Advanced Copper Foil Inc., Mississauga (CA)

(72) Inventor: Kieran Healy, Mississauga (CA)

(73) Assignee: Advanced Copper Foil Inc., Mississauga (CA)

( * ) Notice: Subject to any disclaimer, the term of this patent is extended or adjusted under 35 U.S.C. 154(b) by 0 days.

(21) Appl. No.: 17/868,874

(22) Filed: Jul. 20, 2022

(65) Prior Publication Data

US 2022/0347972 A1    Nov. 3, 2022

Related U.S. Application Data

(63) Continuation of application No. 16/566,176, filed on Sep. 10, 2019, now Pat. No. 11,453,204.

(51) Int. Cl.
*B32B 15/20* (2006.01)
*B32B 15/08* (2006.01)
(Continued)

(52) U.S. Cl.
CPC ............ *B32B 15/20* (2013.01); *B32B 7/025* (2019.01); *B32B 7/12* (2013.01); *B32B 15/08* (2013.01); *B32B 38/0036* (2013.01); *B32B 38/162* (2013.01); *H05K 1/188* (2013.01); *B32B 37/12* (2013.01); *B32B 2309/00* (2013.01); *B32B 2309/02* (2013.01); *B32B 2310/025* (2013.01); *B32B 2310/0445* (2013.01); *B32B 2311/12* (2013.01); *B32B 2327/18* (2013.01); *B32B 2379/08* (2013.01); *H05K 2201/0338* (2013.01); *H05K 2201/0355* (2013.01)

(58) Field of Classification Search
CPC .......... B32B 15/20; B32B 7/12; B32B 15/08; B32B 37/12; B32B 2311/12; B32B 2327/18; B32B 2379/08; B32B 15/085; B32B 27/20; B32B 27/322; B32B 2250/02; B32B 2307/308; B32B 2307/732; B32B 27/281; H05K 2201/0338; H05K 2201/0355; H05K 3/025

See application file for complete search history.

(56) References Cited

U.S. PATENT DOCUMENTS

2010/0170626 A1\* 7/2010 Lochtman ............... B32B 38/10
                                                                156/247
2011/0262722 A1    10/2011 Takamori
(Continued)

FOREIGN PATENT DOCUMENTS

CN      201559335 U     8/2010
JP      2001334574      12/2001
(Continued)

OTHER PUBLICATIONS

International Search Report relating to PCT application No. PCT/CA2016/050938, dated Nov. 10, 2016.

*Primary Examiner* — Cynthia L Schaller
(74) *Attorney, Agent, or Firm* — Rowand LLP (57) ABSTRACT

A supported copper foil is disclosed, comprising: a poly-based film that contains polyimide and polytetrafluoroethylene; a thin copper foil; and an adhesive provided between the poly-based film and the thin copper foil, the adhesive removably coupling the poly-based film to the copper foil.

9 Claims, 5 Drawing Sheets

(51) Int. Cl.
  *B32B 37/12* (2006.01)
  *H05K 1/18* (2006.01)
  *B32B 7/025* (2019.01)
  *B32B 7/12* (2006.01)
  *B32B 38/16* (2006.01)
  *B32B 38/00* (2006.01)

(56) References Cited

U.S. PATENT DOCUMENTS

| | | |
|---|---|---|
| 2015/0123008 A1 | 5/2015 | Fukada |
| 2015/0257253 A1 | 9/2015 | Lee |
| 2018/0077804 A1* | 3/2018 | Stewart .................. H05K 3/02 |

FOREIGN PATENT DOCUMENTS

| | | |
|---|---|---|
| JP | 2002280689 A | 9/2002 |
| WO | 2013161334 | 10/2013 |
| WO | 2017185163 | 11/2017 |
| WO | 2019142790 | 7/2019 |

* cited by examiner

POLY-SUPPORTED COPPER FOIL

CROSS-REFERENCE TO RELATED APPLICATIONS

The present application is a continuation of U.S. patent application Ser. No. 16/566,176 filed on Sep. 10, 2019, the contents of which are incorporated herein by reference.

TECHNICAL FIELD

The present application relates to thin copper foils and, more particularly, to supported copper products and methods for manufacturing and using such supported copper products.

BACKGROUND

Copper foils are used in various electronics applications including, for example, in printed circuit boards (PCB), batteries (e.g., where they may be used for battery wrapping) and shielding (e.g., for radio frequency identification (RFID) shielding, lighting strike shielding, etc.). In many applications, copper foils have become thinner in recent years. For example, in recent years, thin and ultrathin copper foils have gained more widespread adoption. The term "thin" copper foil generally refers to copper foil having a thickness of 12 microns or less. The term "ultrathin" copper foil generally refers to copper having a thickness of 9 microns or less.

As copper foils have become thinner, new challenges have emerged due to the fragile nature of the "thin" and "ultrathin" copper foils. More particularly, thin and ultrathin copper foils are flexible and handling of such foils can cause bending, creasing, or other imperfections in the copper. Such imperfections in the copper can result in imperfections in the end product that includes the copper product. For example, a PCB manufactured using a copper foil having an imperfection, such as a bend, may be defective.

In order to address these challenges, manufacturers of "thin" and "ultrathin" copper foils often removably attach such copper foils to a copper carrier. The copper carrier is often relatively thick in comparison to the copper foil itself. For example, some manufacturers support a nine (9) micron copper foil on a seventy (70) micron copper carrier. The copper carrier is attached to the copper foil using a release layer, such as an inorganic coating. The copper carrier provides rigidity to the copper foil which prevents handling defects such as bending and is removed from the copper foil during manufacture of the end product; for example, during manufacture of a PCB. The copper carrier is not included in the end product that is manufactured using the copper foil but rather is discarded.

Notably, since the copper carrier is relatively thick in comparison to the copper foil, the copper carrier substantially increases the cost of such foils. Furthermore, the copper carrier is typically added to the copper foil using a plating process and, since the copper carrier is thick, the drum that is used in the plating process must operate slowly in order to achieve the desired thickness. This causes the manufacturing process of copper-supported products to be slow.

BRIEF DESCRIPTION OF THE DRAWINGS

Reference will now be made, by way of example, to the accompanying drawings which show example embodiments of the present application and in which.

Like reference numerals are used in the drawings to denote like elements and features.

DETAILED DESCRIPTION OF EXAMPLE EMBODIMENTS

In one aspect, the present application describes a supported copper foil. The supported copper foil includes: a poly-based film that contains polyimide and polytetrafluoroethylene; a thin copper foil; and an adhesive provided between the poly-based film and the thin copper foil, the adhesive removably coupling the poly-based film to the copper foil.

In some implementations, the poly-based film may further contain diphosphene filler particles.

In some implementations, the poly-based film may have a thickness of between 45 and 100 microns.

In some implementations, the poly-based film may have a thickness of 50 microns.

In some implementations, the thin foil copper may be an ultrathin copper foil having a thickness of nine microns or less.

In some implementations, the adhesive may be a low-tack adhesive that allows the thin copper foil to be easily removed from the poly-based film and the adhesive.

In some implementations, the adhesive may be permanently applied to the poly-based film.

In some implementations, the adhesive may contain polyethylene glycol, cyanoacrylate, and silicon dioxide.

In some implementations, the poly-based film may be one that does not deteriorate under heating at temperatures of 225 degrees Celsius.

In some implementations, the adhesive may be uniform across a surface of the poly-based film and uniform across the surface of the thin copper foil.

In another aspect, the present disclosure describes a method of manufacturing a supported copper product. The method includes: providing a thin copper foil and a poly-based film containing polyimide and polytetrafluoroethylene, the poly-based film having an adhesive applied to a surface of the poly-based film; thermally treating the thin copper foil and the poly-based film along their respective lengths, the thermal treatment being adjustable to vary an amount of heat applied to the thin copper foil and the poly-based film; and attaching the thermally treated thin copper foil and the thermally treated poly-based film using the adhesive applied at the surface of the poly-based film.

In some implementations, the thermally treating may comprise guiding the thin copper foil and the poly-based film over respective static heating elements.

In some implementations, the method may further comprise cleaning one or both of the thin copper foil and the poly-based film.

In some implementations, the cleaning may comprise applying a stream of neutrally charged air over portions of one or both of the thin copper foil and the poly-based film.

In some implementations, the cleaning may comprise passing the poly-based film over one or more adhesive take-up rollers, the adhesive take-up roller having a tack for removing debris.

In some implementations, the adhesive take-up roller may be a silicon roller.

In some implementations, the cleaning may comprise electrostatically removing particulates from surfaces of one or both of the thin copper foil and the poly-based film.

In yet another aspect, the present disclosure describes a system for manufacturing a supported copper product. The system includes: a first material handling unit for receiving a thin copper foil; a second material handling unit for receiving a poly-based film, the poly-based film having an adhesive applied to a first surface; at least one heating element for adjustably applying heat to one or both of the thin copper foil and the poly-based film along their respective lengths; and at least one roller coupled with a drive, the drive rotating the roller to pull the thin copper foil into contact with the poly-based film to attach the thin copper foil to the poly-based film using the adhesive applied at the surface of the poly-based film.

In some implementations, the system may further comprise an air curtain for applying a stream of neutrally charged air over portions of one or both of the thin copper foil and the poly-based film.

In some implementations, the system may further comprise a chamber through which one or both of the thin copper foil and the poly-based film are pulled by the at least one roller, the chamber containing one or more electrostatic bars for removing particulates from surfaces of one or both of the thin copper foil and the poly-based film.

In some implementations, the chamber may include, in its interior, an air knife for blowing off removed particulates from the surfaces of one or both of the thin copper foil and the poly-based film.

In some implementations, the chamber may include, in its interior, a take-up vacuum for collecting the removed particulates.

Figure 1:
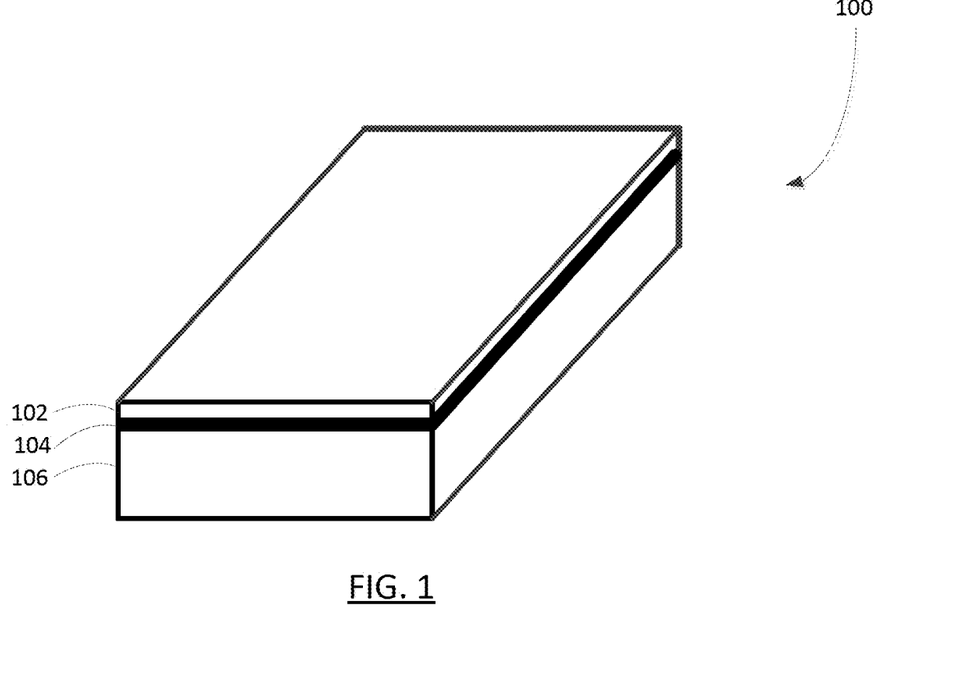
FIG. 1 is a perspective view of a supported copper foil.
Figure 2:
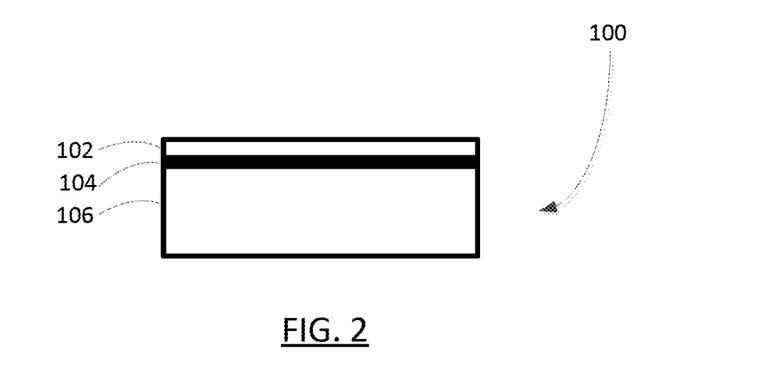
FIG. 2 is a side view of the supported copper foil of FIG. 1.

Other example embodiments of the present disclosure will be apparent to those of ordinary skill in the art from a review of the following detailed descriptions in conjunction with the drawings Reference will first be made to FIGS. 1 and 2, which illustrate an example supported copper foil 100. FIG. 1 illustrates a perspective view of the supported copper foil 100, while FIG. 2 illustrates a side view of the supported copper foil 100. The supported copper foil 100 may also be referred to as a poly-supported copper foil, a supported copper foil, or a supported copper product.

The supported copper foil includes a thin copper foil 102. "Thin" is used herein to refer to foils having a thickness of twelve (12) microns or less. The thin copper foil 102 may be an ultrathin copper foil. An "ultrathin" copper foil is a copper foil having a thickness of nine (9) microns or less. By way of example, in some embodiments, the copper foil has a thickness of approximately 9 microns. In some embodiments, the copper foil has a thickness of approximately 7 microns and in some embodiments, the copper foil has a thickness of approximately 5 microns.

As explained above, "thin" and "ultrathin" copper foils are fragile. In order to provide rigidity to such foils, a poly-based (i.e., a polyester-based) film 106 is removably attached to such copper foils. More specifically, an adhesive 104 is provided between the poly-based film 106 and the thin copper foil 102. The adhesive is permanently attached to the poly-based film and is removably attached to the thin copper foil 102. Thus, when the poly-based film 106 is detached from the thin copper foil 102, the adhesive remains on the poly-based film 106 and not on the thin copper foil 102.

The poly-based film 106 aids in stiffening the thin copper foil and otherwise protects the thin copper foil 102. Accordingly, the poly-based film 106 may be referred to as a protective film. In addition to providing stiffening properties, the poly-based film 106 protects the thin copper foil 102 from dirt and debris.

The thin copper foil 102 is manufactured for use in one or more applications which require the thin copper foil 102 to be subjected to high temperatures. For example, the thin copper foil 102 may be used in manufacturing printed circuit boards (PCBs). During the PCB manufacturing process the thin copper foil 102 may be subjected to temperatures in excess of 180 degrees Celsius or greater in order to cure prepreg and laminate a PCB. The specific temperatures that are required will depend on the nature of the prepreg used, but in at least some instances, the temperatures may even exceed 225 degrees Celsius.

Notably, many poly-based films cannot be heated to such temperatures and would deteriorate under such conditions. Due to the sensitive nature of PCB manufacturing any deterioration that could leave residue on the PCB after manufacture could result in adverse effects, such as a non-functioning PCB.

The poly-based film 106 contains polyimide (PI) and polytetrafluoroethylene (PTFE). In particular, the poly-based film 106 is a hybrid PI/PTFE film. The hybrid film operates well in high-temperature environments. For example, the hybrid film does not deteriorate under a heating temperature of one 180 degrees Celsius, and does not deteriorate at heating temperatures of 200 degrees Celsius. The presence of PI ensures that the hybrid film has good heat resistance. The poly-based film 106 also contains microparticulate fillers. Specifically, the poly-based film 106 contains diphosphene filler particles.

The poly-based film 106 is sufficiently thick to provide rigidity to the thin copper foil 102. In at least some embodiments, the poly-based film 106 has a thickness of 45 microns or greater. For example, the poly-based film 106 may have a thickness of 50 microns. More generally, the poly-based film 106 may have a thickness of between 45 and 100 microns.

The adhesive 104 used to removably couple the poly-based film 106 to the thin copper foil 102 is a low-tack adhesive that allows the thin copper foil 102 to be easily removed from the poly-based film 106 and the adhesive 104 (i.e., it can be removed by a human without mechanical assistance). For example, a peel strength, or average force, to part the adhesive 104 from the thin copper foil 102 may be less than 2 pounds per inch. In particular, the peel strength may be in the range of 0.5 to 1 pound per inch.

The adhesive 104 adheres to the poly-based film 106 with a much greater force than to the thin copper foil 102. For example, the adhesive may be permanently applied to the poly-based film 106. Thus, when the poly-based film 106 is separated from the thin copper foil 102, the adhesive 104 remains on the poly-based film 106 and not on the thin copper foil 102. In this way, no adhesive 104 is transferred to the surface of the thin copper foil 102 upon removing the poly-based film 106 and adhesive 104 from the thin copper foil 102.

In at least some embodiments, the adhesive 104 contains polyethylene glycol polymer. The presence of polyethylene glycol may facilitate various applications of the supported copper foil 100. For example, the polyethylene glycol may serve as a lubricating coating for various surfaces, including PCBs. In particular, the polyethylene glycol can act as a lubricating agent during drilling operations on a PCB. The addition of polyethylene glycol also facilitates "repositionable" properties of the poly-based film 106. That is, the presence of polyethylene glycol in the adhesive 104 may allow limited movement of the poly-based film 106 relative to the thin copper foil 102 after the poly-based film 106 and the thin copper foil 102 are attached. The adhesive 104 may thus facilitate repositioning of the poly-based film 106 after attaching to the thin copper foil 102.

The adhesive 104 may also contain at least one of cyanoacrylate or silicon dioxide. In at least some embodiments, the adhesive 104 may contain all of polyethylene glycol, cyanoacrylate, and silicon dioxide.

The adhesive 104 may be uniformly applied across a surface of the poly-based film 106 and across a surface of the thin copper foil 102. That is, the adhesive 104 may reside at all locations between the poly-based film 106 and the thin copper foil 102 and applied at approximately the same coat weight irrespective of its location on the surfaces. For example, in at least some embodiments, the adhesive may be approximately 25 to 50 microns in thickness. The thickness of the adhesive may be the same across the entire surface of the poly-based film 106. Applying the adhesive across the entire surfaces of the thin copper foil 102 and the poly-based film 106 has been found to enhance rigidity of the thin copper foil 102.

Figure 3:
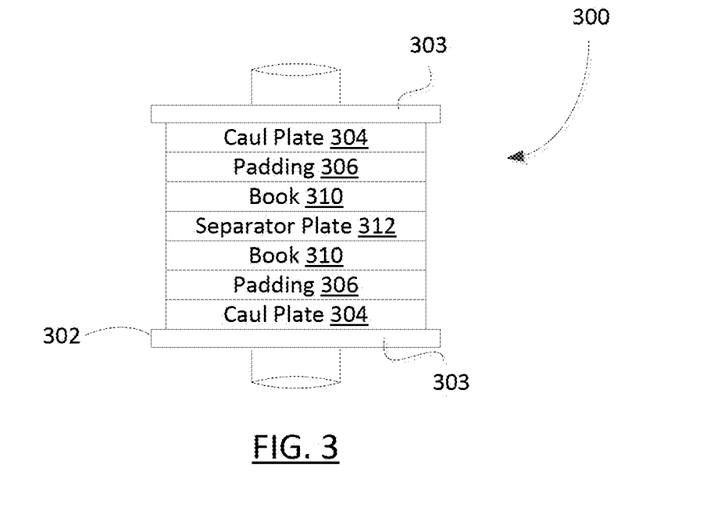
FIG. 3 is a side view of an example lamination press arrangement.

Reference will now be made to FIG. 3, which illustrates an example lamination press arrangement 300 for one application of the high-temperature poly-based supported copper foil 100 of FIGS. 1 and 2.

The lamination press arrangement 300 of FIG. 3 includes a lamination press 302 used to manufacture a PCB. More particularly, in the example the lamination press 302 is used to manufacture a multi-layer PCB. The lamination press 302 is a specialized hydraulic press with heated platens 303. The heated platens 303 are used to cure prepreg. A prepreg (or pre-impregnated layer) is fiberglass that is impregnated with a resin (i.e., a thermosetting epoxy). The resin is dried but not hardened such that it flows when heated, by the lamination press 302, to a curing temperature.

The lamination press 302 is configured to apply heat and pressure to layers which form the PCB to bond them together.

The lamination press 302 includes caul plates 304. The caul plates 304 include both an upper and a lower caul plate. The caul plates 304 (which may also be referred to as carrier plates or tooling plates) rest in the lamination press 302. More particularly, the caul plates 304 are adjacent the heated platens 303.

In at least some embodiments, padding 306 may be inserted between the caul plates 304 and the layers that will form the PCB. That is, there may be upper and lower padding 306, bounding the layers that will form the PCB. This padding 306 is used to control the rate of heat transfer between the heated platens 303 and the layers that will form the PCB. Further, the padding 306 can be used to compensate for imperfections such as non-parallel, bowed or warped platens, imperfections in the caul plates, etc. In some embodiments, the padding 306 may include several plies of thick Kraft paper. In some embodiments, the padding 306 may include press pad.

One or more books 310 are provided between the caul plates 304 and between the padding 306. In the example of FIG. 3, two books 310 are illustrated. However, a greater or lesser number of books may be inserted within the lamination press at any given time. For example, in some embodiments, only a single book is included. In other embodiments, a greater number of books are included. By way of example, in one embodiment, six books may be included in the lamination press at a given time.

The books 310 may be separated from one another by a separator plate 312. The separator plate 312 is a hard metal plate, such as stainless steel (in which case the separator plate may be referred to as a stainless steel separator plate).

Figure 4:
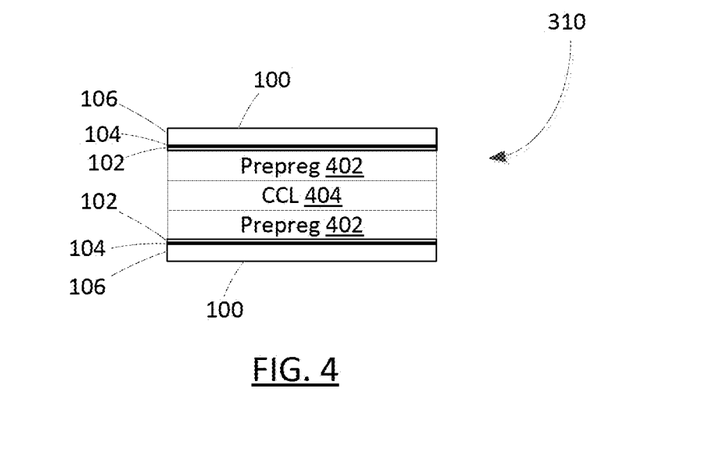
FIG. 4 is a side view of an example book for use in the lamination press arrangement of FIG. 3.

Reference will now be made to FIG. 4, which illustrates an example book 310. The example book 310 includes two supported copper foils 100. The supported copper foils 100 are of the type described above with reference to FIGS. 1 and 2. A first one of the supported copper foils 100 is located at the bottom of the book 310 and a second one of the supported copper foils 100 is located at the top of the book 310. The poly-based films 106 of the supported copper foils 100 are outward facing. That is, the poly-based films 106 form the outside layer of the book 310. Notably, in this orientation, the poly-based films 106 help to provide some padding, much like the paddings 306 of FIG. 3 discussed above. The padding provided by the poly-based films 106 can help reduce the transmission of imperfections from the separator plates 312 or the caul plates 304 to the thin copper foil 102.

The thin copper foil 102 of the supported copper foils 100 are adjacent to and in contact with prepreg 402. For example, a first prepreg 402 is adjacent the thin copper foil 102 associated with the bottom one of the supported copper foils 100 and a second prepreg 402 is adjacent the thin copper foil 102 associated with the top one of the supported copper foils 100.

Between the first and second prepreg is one or more copper clad laminates (CCL) 404. That is, a first prepreg may be adjacent the thin copper foil of a first supported copper foil 100 and also adjacent the CCL 404 and a second prepreg may be located at a side of the CCL that opposes the side adjacent the first prepreg.

The copper clad laminate (CCL) may be a two-sided CCL 404. In the example, only a single CCL 404 is included to form a four-layer PCB. However, in practice, there may be a greater number of CCLs included. Each CCL layer is separated from adjacent CCL layers with prepreg.

Figure 5:
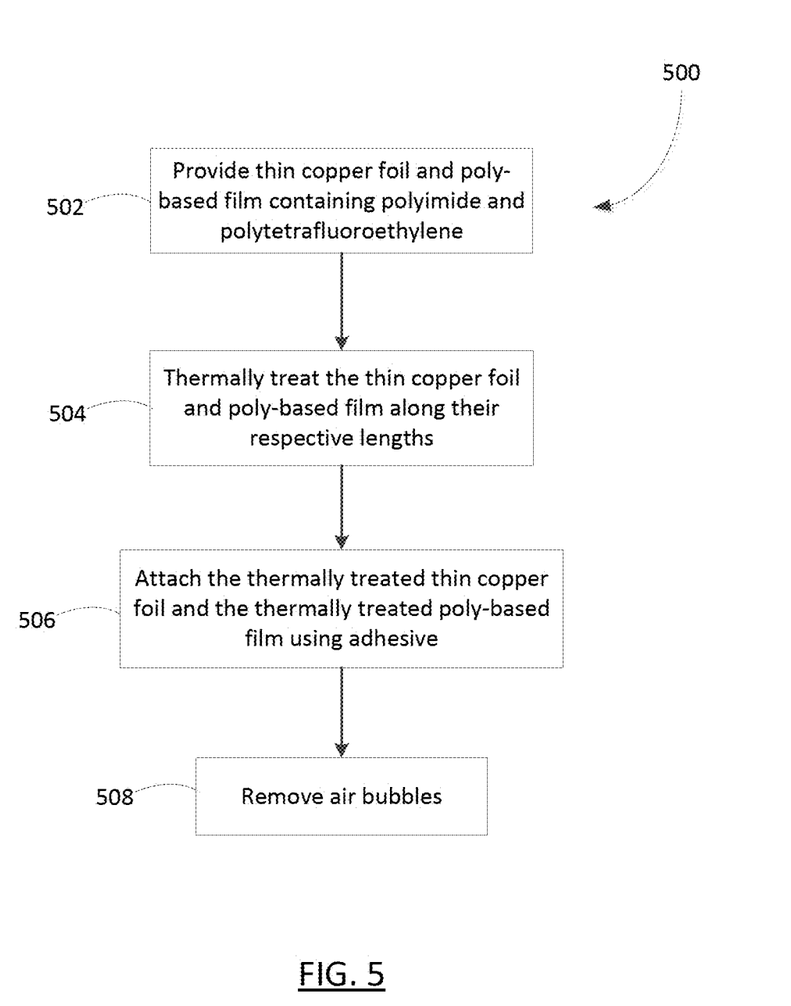
FIG. 5 shows, in flowchart form, an example method of manufacturing a supported copper product.

Reference is now made to FIG. 5, which shows, in flowchart form, an example method 500 of manufacturing a supported copper product, such as the supported copper foil 100 of FIGS. 1 and 2. The method 500 may be performed in a clean room environment.

In operation 502, the method 500 includes providing a thin copper foil of the type described with reference to FIGS. 1 and 2 and a poly-based film of the type described with reference to FIGS. 1 and 2. Specifically, the poly-based film contains PI and PTFE, and has an adhesive applied to a surface of the poly-based film. The adhesive may, for example, be an adhesive of the type described above with reference to FIGS. 1 and 2.

In operation 504, the thin copper foil and the poly-based film are thermally treated along their respective lengths. In at least some embodiments, the thermal treatment may be adjustable to vary the amount of heat that is applied to the thin copper foil and the poly-based film. That is, the amount of heat applied may be varied during thermal treatment. For example, one or both of the thin copper foil and the poly-based film may be guided over respective static heating elements or sources. Increasing the amount of applied heat may make the poly-based film more "pliable" or "malleable", helping to reduce internal stress along the length of the poly-based film. This can, in turn, help to prevent bending or deforming the thin copper foil in the supported copper foil. The applied temperature may vary, for example, based on a thickness of the thin copper foil. For example, higher temperatures may be applied during thermal treatment of thinner copper foils.

In operation 506, the thermally treated thin copper foil is attached to the thermally treated poly-based film using the adhesive applied to the surface of the poly-based film. For example, the thin copper foil and the poly-based film may be pressed into contact. In at least some embodiments, the poly-based film may be held taut during the attaching.

In operation 508, the thermally treated thin copper foil and the thermally treated poly-based film may be processed to remove any air bubbles between these layers. For example, in some embodiments, the thermally treated thin copper foil and the thermally treated poly-based film are squeezed together by roller to roll out any air bubbles.

The supported copper product may have various different applications. For example, the supported copper foil may be used for the terminal layers of a multi-layer PCB. As another example, the supported copper foil may be used for battery wrapping and shielding (e.g., for radio frequency identification (RFID) shielding, lighting strike shielding, etc.) applications.

Furthermore, the supported copper foil may, in some embodiments, be used to make a CCL itself. CCLs are generally manufactured by laminating prepreg between two layers of the supported copper foils. The manufacture of CCLs differs from the manufacture of PCBs in that the CCLs are cores which do not have other CCL layers provided therein. Rather, they are manufactured by providing a single prepreg layer between adjacent supported copper foils (with the poly-based films externally facing) and laminating in a lamination press, which generally provides the same function as the lamination press of FIG. 3, but which may be much larger than the lamination press of the type described with reference to FIG. 3.

Figure 6:
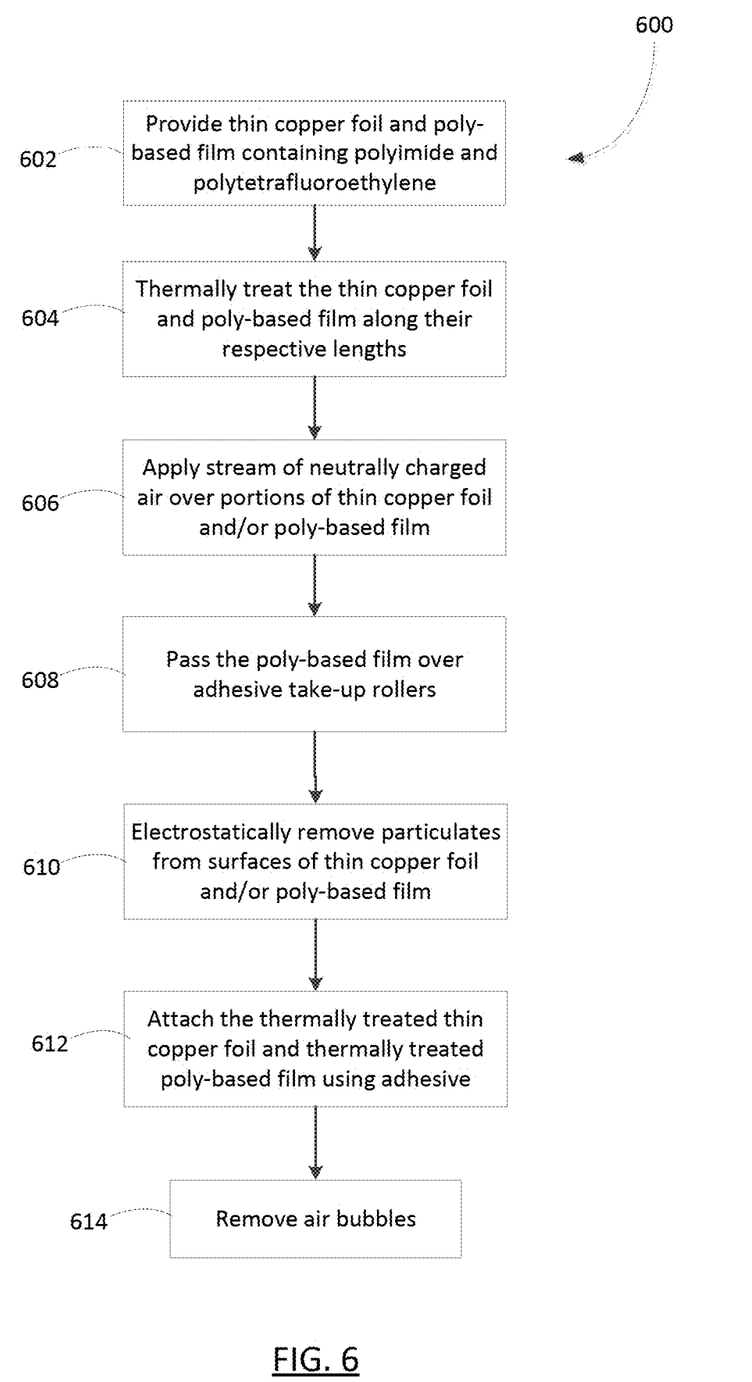
FIG. 6 shows, in flowchart form, another example method of manufacturing a supported copper product.

Reference is now made to FIG. 6, which shows, in flowchart form, another example method 600 of manufacturing a supported copper product, such as the supported copper foil 100 of FIGS. 1 and 2.

In operation 602, a thin copper foil and a poly-based film containing PI and PTFE are provided, the poly-based film having an adhesive applied to a surface of the poly-based film. In operation 604, one or both of the thin copper foil and the poly-based film are thermally treated along their respective lengths.

In method 600, at least one of the thin copper foil or the poly-based film is cleaned. For example, in operation 606, a stream of neutrally charged air may be applied over portions of the thin copper foil and/or the poly-based film. This de-ionization step may reduce static electricity on the surfaces of the thin copper foil and the poly-based film, which can prevent debris (e.g. hair, etc.) from sticking to the surfaces. As another example of a cleaning operation, in operation 608, the poly-based film may be passed over one or more adhesive take-up rollers. The adhesive take-up rollers may, for example, contain one or more tacks for removing debris from surface of the poly-based film. The adhesive take-up roller may, in some embodiments, be a silicon roller. The thin copper foil and/or the poly-based film may be further cleaned by electrostatically removing particulates from their surfaces. In particular, in operation 610, particulates that adhere to surfaces of the thin copper foil and/or the poly-based film may be removed electrostatically. For example, an electrostatic neutralizer (e.g. electrostatic bars) may be used to break the static bond of any foreign materials or unwanted particulates, and an air knife system (or similar cleaning tool using compressed air) may blow the debris off of the surfaces of the thin copper foil and/or poly-based film.

The thermally treated and cleaned thin copper foil and poly-based film are attached to each other using the adhesive, in operation 612, and air bubbles from the respective surfaces may be removed in operation 614.

Figure 7:
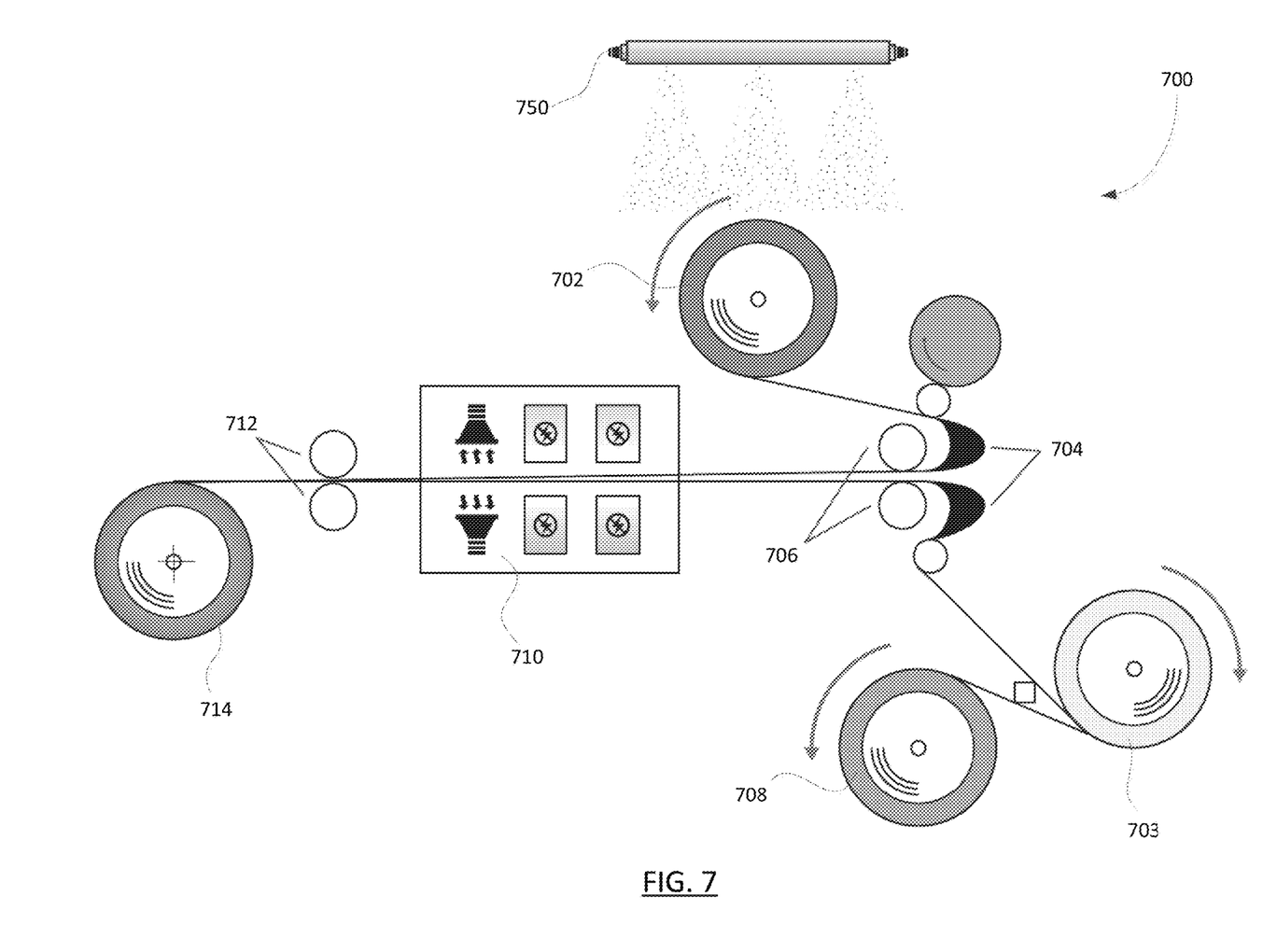
FIG. 7 is a block diagram of an example machine for manufacturing a supported copper product.

Reference is now made to FIG. 7, which illustrates, in block form, a sample machine 700 for manufacturing a supported copper product, such as the supported copper foil 100 of FIGS. 1 and 2. The machine 700 may be located in a clean room environment, in some embodiments.

The machine 700 includes a first material handling unit 702. The first material handling unit 702 receives the thin copper foil 102 of the type described herein with reference to FIGS. 1 and 2. The thin copper foil 102 may be received in roll form. In at least some embodiments, the first material handling unit 702 allows the roll to rotate.

The machine 700 also includes a second material handling unit. 703. The second material handling unit 703 is for receiving a poly-based film 106 of the type described above with reference to FIGS. 1 and 2. In at least some embodiments, the poly-based film 106 has an adhesive applied to a surface of the poly-based film 106. That is, one side of the poly-based film may have an adhesive of the type described herein applied thereon. In at least some embodiments, a liner, such as a Mylar liner, may act as a backing to the adhesive. A Mylar take-up roller 708 may provide the Mylar liner for attaching to the adhesive. The poly-based film may be received in roll form. In at least some embodiments, the second material handling unit 703 allows the roll to rotate.

At least one roller 706 (or other material gripper) is provided in the machine, and, at least one of the rollers (or another material gripper) is coupled with a drive. The drive rotates the roller 706 (or otherwise drives the material gripper) causing the roller 706 to pull the thin copper foil into contact with the poly-based film to attach the thin copper foil to the poly-based film using the adhesive applied to the surface of the poly-based film.

The at least one roller 706 may be configured to remove any air bubbles between the poly-based film 106 and the thin copper foil 102 and may, in at least some embodiments, be configured to apply a force to the poly-based film 106 to hold the poly-based film taut during the attaching.

The machine 700 also includes at least one heating element 704 for adjustably applying heat to one or both of the thin copper foil and the poly-based film along their respective lengths. The heating elements 704 may, in some embodiments, be positioned adjacent to the at least one roller 706 such that the thin copper foil and/or the poly-based film may be thermally treated using the heating elements 704 prior to attaching the thin copper foil and the poly-based film. The amount of heat applied by the heating elements 704 may be adjustable, such that the temperature at which the thin copper foil and the poly-based film are thermally treated can vary. For example, the temperature may be varied based on a thickness of the thin copper foil that is being treated.

The machine 700 may include a de-ionization source 750. The de-ionization source 750 may provide an air curtain for applying a stream of neutrally charged air over portions of one or both of the thin copper foil and the poly-based film. In FIG. 7, the air curtain is positioned over the thin copper foil only. In some embodiments, the de-ionization may be performed for both the thin copper foil and the poly-based film.

The machine 700 may include a chamber 710 for electrostatic cleaning. The thin copper foil and the poly-based film are pulled through the chamber by at least one roller. In at least some embodiments, the chamber 710 includes one or more electrostatic bars for removing particulates from surfaces of one or both of the thin copper foil and the poly-based film. For example, the chamber 710 may include, in its interior, a plurality of electrostatic bars (or different electrostatic neutralizer) an air knife for blowing off removed particulates from the surfaces of one or both of the thin copper foil and the poly-based film. The chamber 710 may also include, in its interior, a take-up vacuum for collecting the removed particulates.

The machine 700 may also include a cleaner 705 for cleaning the thin copper foil 102 prior to the attaching. Such cleaners 705 may include one or more adhesive take-up rollers which have a tack for removing debris. In some embodiments, the adhesive take-up rollers may include silicone rollers.

The machine 700 may additionally include one or more pull rollers 712 and a take-up roller 714. The pull rollers 712 and take-up roller 714 may be positioned such that the supported copper foil may be taken up after having been thermally treated (by the heating elements 704) and cleaned in the chamber 710.

The machine 700 may also include a punching station which adds tooling holes for receipt in the lamination press. The punching station is located so that holes are applied after the thin copper foil has been attached to the poly-based film.

The machine 700 may also include a shearing station. The shearing station cuts the supported copper foil into panels that fit within the lamination press 302. For example, in one embodiment, the supported copper foil is cut into 18"×24" panels.

The various embodiments presented above are merely examples and are in no way meant to limit the scope of this application. Variations of the innovations described herein will be apparent to persons of ordinary skill in the art, such variations being within the intended scope of the present application. In particular, features from one or more of the above-described example embodiments may be selected to create alternative example embodiments including a sub-combination of features which may not be explicitly described above. In addition, features from one or more of the above-described example embodiments may be selected and combined to create alternative example embodiments including a combination of features which may not be explicitly described above. Features suitable for such combinations and sub-combinations would be readily apparent to persons skilled in the art upon review of the present application as a whole. The subject matter described herein and in the recited claims intends to cover and embrace all suitable changes in technology.

The invention claimed is:

1. A supported copper foil comprising:
   a poly-based film that contains polyimide, polytetrafluoroethylene, and diphosphene filler particles;
   a thin copper foil; and
   an adhesive provided between the poly-based film and the thin copper foil, the adhesive removably coupling the poly-based film to the copper foil.

2. The supported copper foil of claim 1, wherein the poly-based film has a thickness of between 45 and 100 microns.

3. The supported copper foil of claim 2, wherein the poly-based film has a thickness of 50 microns.

4. The supported copper foil of claim 1, wherein the thin foil copper is an ultrathin copper foil having a thickness of nine microns or less.

5. The supported copper foil of claim 1, wherein the adhesive is a low-tack adhesive that allows the thin copper foil to be easily removed from the poly-based film and the adhesive.

6. The supported copper foil of claim 5, wherein the adhesive is permanently applied to the poly-based film.

7. The supported copper foil of claim 1, wherein the adhesive contains polyethylene glycol, cyanoacrylate, and silicon dioxide.

8. The supported copper foil of claim 1, wherein the poly-based film does not deteriorate under heating at temperatures of 225 degrees Celsius.

9. The supported copper foil of claim 1, wherein the adhesive is uniform across a surface of the poly-based film and uniform across a surface of the thin copper foil.

* * * * *